United States Patent [19]
Gallager

[11] Patent Number: 4,700,349
[45] Date of Patent: Oct. 13, 1987

[54] CODED MODULATION SYSTEM

[75] Inventor: Robert G. Gallager, Lexington, Mass.

[73] Assignee: Codex Corporation, Mansfield, Mass.

[21] Appl. No.: 577,044

[22] Filed: Feb. 6, 1984

[51] Int. Cl.⁴ ............................................. G06F 11/10
[52] U.S. Cl. ....................................... 371/30; 371/43; 375/25
[58] Field of Search ................. 371/43, 44, 45, 30; 375/27, 34, 39, 25

[56] References Cited

U.S. PATENT DOCUMENTS

| | | | |
|---|---|---|---|
| 4,077,021 | 2/1978 | Csajka et al. | 332/9 R |
| 4,483,012 | 11/1984 | Wei | 371/43 X |
| 4,493,082 | 1/1985 | Cumberton et al. | 371/43 |
| 4,520,490 | 5/1985 | Wei | 371/43 X |

FOREIGN PATENT DOCUMENTS 2088676 6/1982 United Kingdom .................. 371/43

OTHER PUBLICATIONS

Ungerboeck, "Channel Coding with Mutlilevel/Phase Signals", IEEE Transactions on Information Theory, vol. IT–28, No. 1, Jan. 1982, pp. 55–67.

Forney, "The Viterbi Algorithm", Proceedings of the IEEE, vol. 61, No. 3, Mar., 1983, pp. 268–278.

Miller, "Four—Dimensional Modulation and Coding: An Alternate To Frequency—Reuse, Report No. UVA/528200/EE83/107, Sep., 1983.

Fang & Lee, "Four—Dimensionally Coded PSK Systems for Combatting Effects of Severe ISI and CCI", IEEE, 1983, pp. 1032–1038.

Primary Examiner—Charles E. Atkinson

[57] ABSTRACT

In a modulation system for sending digital symbols over a band-limited channel in accordance with a sequence of multi-dimensional points each composed of a plurality of two-dimensional modulation signal points, and each selected from an available alphabet of the multi-dimensional points by an encoder on the basis of a group of the digital symbols, the improvement which includes circuitry for accumulating the symbols of each group, and circuitry for thereafter selecting the multi-dimensional point for the group, and in which the available alphabet includes a plurality of subsets of the multi-dimensional points, and the subset from which the multi-dimensional point is selected for each group depends on the subset from which the multi-dimensional point is selected for another one of the groups.

14 Claims, 12 Drawing Figures

| PRESENT STATE | | NEXT STATE | | PRESENT STATE | | NEXT STATE | |
|---|---|---|---|---|---|---|---|
| $S_1 S_2 S_3$ | $i_1 i_2 i_3$ | $S_1 S_2 S_3$ | $i_1 i_2 i_3 p$ | $S_1 S_2 S_3$ | $i_1 i_2 i_3$ | $S_1 S_2 S_3$ | $i_1 i_2 i_3 p$ |
| 000 | 000 | 000 | 0000 | 100 | 000 | 010 | 0000 |
| 000 | 111 | 000 | 1111 | 100 | 111 | 010 | 1111 |
| 000 | 001 | 101 | 0011 | 100 | 001 | 111 | 0011 |
| 000 | 110 | 101 | 1100 | 100 | 110 | 111 | 1100 |
| 000 | 010 | 110 | 0101 | 100 | 010 | 100 | 0101 |
| 000 | 101 | 110 | 1010 | 100 | 101 | 100 | 1010 |
| 000 | 011 | 011 | 0110 | 100 | 011 | 001 | 0110 |
| 000 | 100 | 011 | 1001 | 100 | 100 | 001 | 1001 |
| 001 | 000 | 000 | 0001 | 101 | 000 | 010 | 0001 |
| 001 | 111 | 000 | 1110 | 101 | 111 | 010 | 1110 |
| 001 | 001 | 101 | 0010 | 101 | 001 | 111 | 0010 |
| 001 | 110 | 101 | 1101 | 101 | 110 | 111 | 1101 |
| 001 | 010 | 110 | 0100 | 101 | 010 | 100 | 0100 |
| 001 | 101 | 110 | 1011 | 101 | 101 | 100 | 1011 |
| 001 | 011 | 011 | 0111 | 101 | 011 | 001 | 0111 |
| 001 | 100 | 011 | 1000 | 101 | 100 | 001 | 1000 |
| 010 | 000 | 001 | 0000 | 110 | 000 | 011 | 0000 |
| 010 | 111 | 001 | 1111 | 110 | 111 | 011 | 1111 |
| 010 | 001 | 100 | 0011 | 110 | 001 | 110 | 0011 |
| 010 | 110 | 100 | 1100 | 110 | 110 | 110 | 1100 |
| 010 | 010 | 111 | 0101 | 110 | 010 | 101 | 0101 |
| 010 | 101 | 111 | 1010 | 110 | 101 | 101 | 1010 |
| 010 | 011 | 010 | 0110 | 110 | 011 | 000 | 0110 |
| 010 | 100 | 010 | 1001 | 110 | 100 | 000 | 1001 |
| 011 | 000 | 001 | 0001 | 111 | 000 | 011 | 0001 |
| 011 | 111 | 001 | 1110 | 111 | 111 | 011 | 1111 |
| 011 | 001 | 100 | 0010 | 111 | 001 | 110 | 0010 |
| 011 | 110 | 100 | 1101 | 111 | 110 | 110 | 1101 |
| 011 | 010 | 111 | 0100 | 111 | 010 | 101 | 0100 |
| 011 | 101 | 111 | 1011 | 111 | 101 | 101 | 1011 |
| 011 | 011 | 010 | 0111 | 111 | 011 | 000 | 0111 |
| 011 | 100 | 010 | 1000 | 111 | 100 | 000 | 1000 |

$\hat{m}(000, 000) = m(000) + b(000),$
$\hat{m}(000, 001) = m(000) + b(011),$
$\hat{m}(000, 110) = m(000) + b(101),$
$\hat{m}(000, 011) = m(000) + b(110);$ $\hat{m}(001, 000) = m(001) + b(001),$
$\hat{m}(001, 101) = m(001) + b(010),$
$\hat{m}(001, 110) = m(001) + b(100),$
$\hat{m}(001, 011) = m(001) + b(111);$ $\hat{m}(010, 001) = m(010) + b(000),$
$\hat{m}(010, 100) = m(010) + b(011),$
$\hat{m}(010, 111) = m(010) + b(101),$
$\hat{m}(010, 010) = m(010) + b(110);$ $\hat{m}(011, 001) = m(011) + b(001),$
$\hat{m}(011, 100) = m(011) + b(010),$
$\hat{m}(011, 111) = m(011) + b(100),$
$\hat{m}(011, 010) = m(011) + b(111);$ $\hat{m}(000, 010) = m(100) + b(000),$
$\hat{m}(000, 111) = m(100) + b(011),$
$\hat{m}(100, 100) = m(100) + b(101),$
$\hat{m}(100, 001) = m(100) + b(110);$ $\hat{m}(101, 010) = m(101) + b(001),$
$\hat{m}(101, 111) = m(101) + b(010),$
$\hat{m}(101, 100) = m(101) + b(100),$
$\hat{m}(101, 001) = m(101) + b(111);$ $\hat{m}(110, 011) = m(110) + b(000),$
$\hat{m}(110, 110) = m(110) + b(011),$
$\hat{m}(110, 101) = m(110) + b(101),$
$\hat{m}(110, 000) = m(110) + b(110);$ $\hat{m}(111, 011) = m(111) + b(001),$
$\hat{m}(111, 110) = m(111) + b(010),$
$\hat{m}(111, 101) = m(111) + b(100),$
$\hat{m}(111, 000) = m(111) + b(111);$

FIG. 9

$\hat{m}(000) = \min[\hat{m}(000,000), \hat{m}(001,000),$
$\qquad \hat{m}(110,000), \hat{m}(111,000)],$ $\hat{m}(001) = \min[\hat{m}(010,001), \hat{m}(011,001),$
$\qquad \hat{m}(100,001), \hat{m}(101,001)],$ $\hat{m}(010) = \min[\hat{m}(010,010), \hat{m}(011,010),$
$\qquad \hat{m}(100,010), \hat{m}(101,010)],$ $\hat{m}(011) = \min[\hat{m}(000,011), \hat{m}(001,011),$
$\qquad \hat{m}(110,011), \hat{m}(111,011)],$ $\hat{m}(100) = \min[\hat{m}(010,100), \hat{m}(011,100),$
$\qquad \hat{m}(100,100), \hat{m}(101,100)],$ $\hat{m}(101) = \min[\hat{m}(000,101), \hat{m}(001,101),$
$\qquad \hat{m}(110,101), \hat{m}(111,101)],$ $\hat{m}(110) = \min[\hat{m}(000,110), \hat{m}(001,110),$
$\qquad \hat{m}(110,110), \hat{m}(111,110)],$ $\hat{m}(111) = \min[\hat{m}(010,111), \hat{m}(011,111),$
$\qquad \hat{m}(100,111), \hat{m}(101,111)].$

FIG. 10

| | | | | | | | |
|---|---|---|---|---|---|---|---|
| $i_1^{(1)}$ | $p^{(1)}$ | $p^{(2)}$ | $p^{(3)}$ | $i_1^{(1)}$ | $p^{(1)}$ | $i_1^{(2)}$ | $p^{(4)}$ |
| $i_2^{(1)}$ | $p^{(1)}$ | $p^{(3)}$ | $p^{(4)}$ | $i_2^{(1)}$ | $p^{(1)}$ | $i_3^{(2)}$ | $p^{(5)}$ |
| $i_3^{(1)}$ | $p^{(1)}$ | $p^{(2)}$ | $p^{(4)}$ | $i_2^{(1)}$ | $p^{(1)}$ | $i_1^{(2)}$ | $p^{(2)}$ |
| $i_1^{(1)}$ | $i_2^{(1)}$ | $p^{(2)}$ | $p^{(4)}$ | $i_3^{(1)}$ | $p^{(1)}$ | $i_1^{(2)}$ | $p^{(3)}$ |
| $i_1^{(1)}$ | $i_3^{(1)}$ | $p^{(3)}$ | $p^{(4)}$ | $i_3^{(1)}$ | $p^{(1)}$ | $i_2^{(2)}$ | $p^{(5)}$ |
| $i_2^{(1)}$ | $i_3^{(1)}$ | $p^{(2)}$ | $p^{(3)}$ | $i_2^{(1)}$ | $p^{(1)}$ | $i_1^{(3)}$ | $p^{(5)}$ |
| $i_1^{(1)}$ | $i_2^{(1)}$ | $i_3^{(1)}$ | $p^{(1)}$ | $i_2^{(1)}$ | $i_3^{(1)}$ | $i_1^{(2)}$ | $p^{(4)}$ |
| $i_1^{(1)}$ | $i_3^{(1)}$ | $i_1^{(2)}$ | $p^{(2)}$ | $i_2^{(1)}$ | $i_3^{(1)}$ | $i_2^{(2)}$ | $i_1^{(3)}$ |
| $i_1^{(1)}$ | $i_3^{(1)}$ | $i_2^{(2)}$ | $i_3^{(2)}$ | $i_2^{(1)}$ | $i_3^{(1)}$ | $i_3^{(2)}$ | $p^{(5)}$ |
| $i_1^{(1)}$ | $i_2^{(1)}$ | $i_1^{(2)}$ | $p^{(3)}$ | $i_2^{(1)}$ | $p^{(1)}$ | $i_2^{(2)}$ | $i_3^{(2)}$ |
| $i_1^{(1)}$ | $p^{(1)}$ | $i_2^{(2)}$ | $i_1^{(3)}$ | $i_3^{(1)}$ | $p^{(1)}$ | $i_3^{(2)}$ | $i_1^{(3)}$ |

CODED MODULATION SYSTEM

BACKGROUND OF THE INVENTION

This invention relates to transmitting digital symbols over a band-limited channel by modulating a carrier in accordance with a sequence of signals selected from an available signal constellation by a coding technique which introduces dependencies between signals in the sequence to increase immunity to noise (i.e., to achieve a so-called "coding gain" compared with an uncoded system).

Csajka et al., U.S. Pat. No. 4,077,021, and Ungerboeck, "Channel Coding with Multilevel/Phase Signals," IEEE Transactions on Information Theory, Vol. IT-28, No. 1, January, 1982, incorporated herein by reference, disclose a coding system in which a conventional two-dimensional signal constellation having $2^N$ signal points (the number needed for simple mapping of symbols having N bits in an uncoded system in which no dependencies are introduced between signal points) is doubled in size to $2^{N+1}$ signal points. An encoder introduces a degree of redundancy by adding one bit of information to each N-bit symbol, based on the state of a finite-state memory in the encoder, and the resulting N+1 bits for each symbol are mapped into one of the $2^{N+1}$ possible signal points in the constellation. The signal points are organized into subsets which are disjoined (i.e., have no signal points in common) and arranged so that the minimum distance between two signal points belonging to one subset is greater than the minimum distance between any two signal points in the constellation. The state of the finite state memory is arranged to depend on the subsets from which past signals were drawn. The encoder performs a coding function by using the state of the finite state memory as the basis for determining the subset from which each signal is to be drawn. Because this coding effectively permits only certain sequences of signals to be transmitted, each signal carries (in the form of the identity of the subset from which it is drawn) historical information which is exploited at the receiver to decode the sequence of received signals using a maximum likelihood sequence estimation technique (e.g., one based on the Viterbi Algorithm, as described in Forney, "The Viterbi Algorithm," Proceedings of the IEEE, Vol. 61, No. 3, March, 1973, incorporated herein by reference).

Another coding system, disclosed in copending patent application. U.S. Ser. No. 439,740, Forney, and now U.S. Pat. No. 4,562,426 issued 12/31/85, uses a signal constellation having more than $2^N$ but fewer than $2^{N+1}$ signal points organized into two subsets which are partially overlapping and partially disjointed. A two-state encoder is arranged in such a way that on average only a portion of the sent signals carry historical information (i.e., include redundancy).

Another copending patent application, U.S. Ser. No. 485,069. Forney, and now U.S. Pat. No. 4,597,090 issued 6/24/86, shows systems in which the symbols to be sent are taken in groups, each having at least two symbols. Each group is encoded independently into a multi-dimensional point corresponding in turn to two or more two-dimensional signal points. The set of multi-dimensional points from which each multi-dimensional point may be drawn is independent of the two-dimensional signal points sent for any other group of symbols, but there is an interdependence among the signal points drawn for a given group.

SUMMARY OF THE INVENTION

In general the invention features, in one aspect, an improvement in a modulation system for sending digital symbols over a band-limited channel in accordance with a sequence of multi-dimensional points each composed of a plurality of two-dimensional modulation signal points, and each selected from an available alphabet of the multi-dimensional points by an encoder on the basis of a group of the digital symbols, the improvement including circuitry for adcumulating the symbols of each group, and circuitry for thereafter selecting the multi-dimensional point for the group, and wherein the available alphabet includes a plurality of subsets of the multi-dimensional points and the subset from which the multi-dimensional point is selected for each group depends on the subset from which the multi-dimensional point is selected for another group.

In preferred embodiments the accumulating circuitry is arranged to add less than one bit per symbol interval of information about the dependencies among the selected multi-dimensional points (preferably no more than one-half bit per symbol interval); there is a decoder for deciding which multi-dimensional points were sent by applying a maximum likelihood sequence estimation technique to a sequence of multi-dimensional values received over the channel; the encoder includes a finite state device whose next state depends upon at least an earlier state of the device; there are a plurality of subsets of the two-dimensional signal points and the minimum squared distance in two-dimensional space between signal points from the same subset is greater than the minimum squared distance between any two signal points; each group comprises two symbols and the multi-dimensional point alphabet is four-dimensional; the finite state device has eight states; each symbol has 7 bits and there are 240 distinct two-dimensional signal points; the modulation system is a double side band--quadrature carrier system; there are four subsets of signal points; and there is circuitry for effecting 180 differential encoding of said symbols.

The system achieves a coding gain with a redundancy (in the preferred embodiments) of less than one bit per symbol interval.

Other advantages and features will be apparent from the following description of the preferred embodiment, and from the claims.

DESCRIPTION OF THE PREFERRED EMBODIMENT

We first briefly describe the drawings.

Drawings

STRUCTURE AND OPERATION

Figure 1:
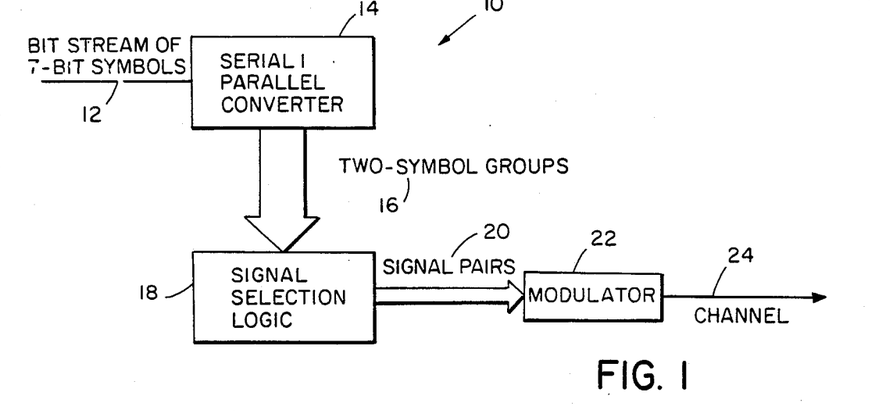
FIG. 1 is a block diagram of a data transmitter.

Referring to FIG. 1, in transmitter 10 (a programmed microprocessor) an input bit stream 12 (appearing at a bit rate of, for example, 19,200 bits per second) is made up of a sequence of digital symbols each having the same number of bits (N). The symbols are taken two at a time by serial/parallel converter 14 to form groups 16 each having two symbols. N is selected (e.g. N=7) so that the number of bits (2N) in each group 16 is an integer. (But N need not be integral.) Each two-symbol group 16 is encoded by signal selection logic 18 into a pair of two-dimensional signals 20, which are used successively by modulator 22 for conventional DSB-QC modulation and transmission over channel 24 at a rate of 2400×8/7 baud, corresponding to 7 bits per modulation interval.

The encoding process can be viewed as first selecting for each two-symbol group 16 a single four-dimensional point (i.e., a multi-dimensional point of more than two dimensions) from an available alphabet of four-dimensional points in four-dimensional space (called 4-space), and then using the four coordinate values of the selected multi-dimensional point to specify the two pairs of coordinates of the two two-dimensional signal points.

Figure 2:
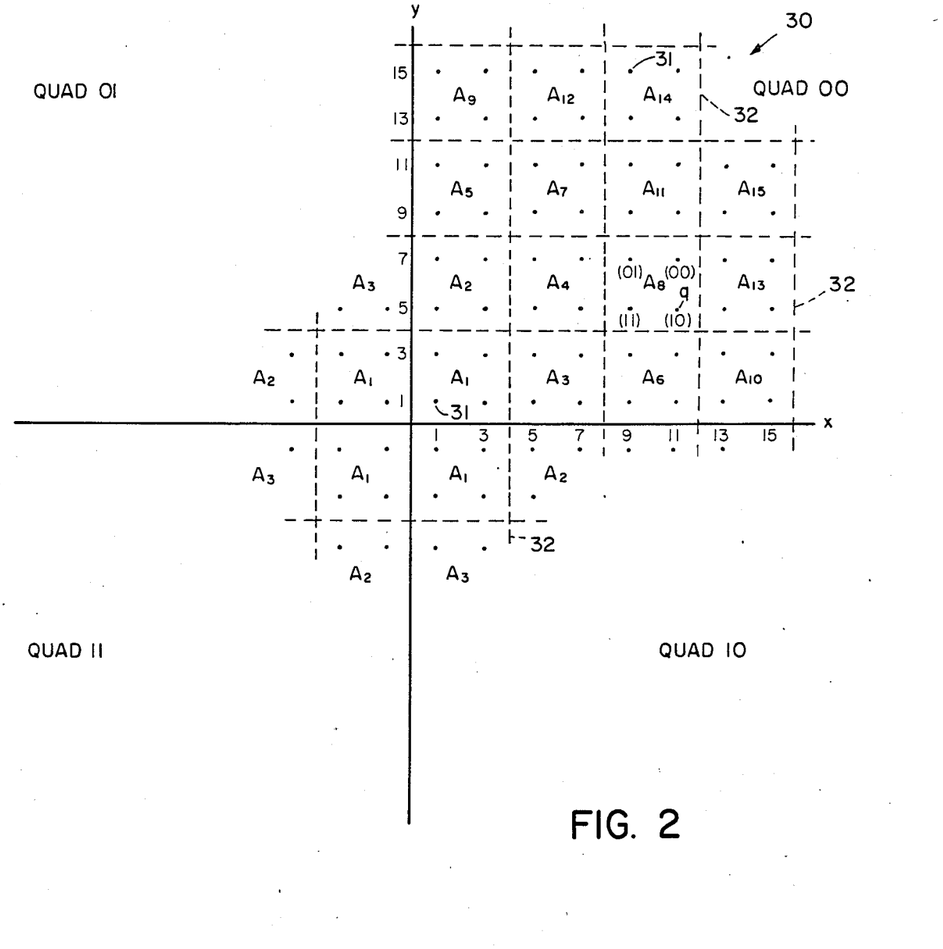
FIG. 2 is a diagram of representative signal points on a signal point constellation.

Referring to FIG. 2, each signal is drawn from a two-dimensional constellation 30 having 240 signal points 31 (i.e., more than the $2^N=128$ signal points required in an uncoded system but fewer than $2^{N+1}=256$ signal points). Each signal point 31 has odd integral coordinate values. All signal points 31 are grouped into four different subsets, respectively denoted (00), (01), (10), and (11), where for each subset the two bits in parentheses are respectively the least significant bits of the binary values of a and b taken from the following expression for the x and y coordinates of the signal:

$$(x, y) = (1+2a, 1+2b)$$

For example, signal point q has coordinates (x, y)=(11, 5), so that a=5=binary 101, b=2=binary 10. Thus, the least significant bits of a and b are a=1, and b=0, and signal point q is therefore in subset (10).

The complex signal plane can be viewed as being divided into 60 contiguous square sectors 32 each containing four signal points, one from each subset. Each quadrant of the plane contains 15 sectors, each identified by a value $A_n$ (n an integer between 1 and 15) where n generally reflects the relative distance of a sector from the origin (e.g., sector $A_{15}$ is farther from the origin than sector $A_8$).

The multi-dimensional points of the four-dimensional point alphabet similarly are categorized into 16 different multi-dimensional point subsets, each corresponding to a different combination of two signal point subsets. The multi-dimensional point subsets are respectively denoted (0000), (0001) . . . , the first two and final two bits of the value in parentheses being respectively the designations of the two signal point subsets to which the multi-dimensional point subset corresponds. For example, multi-dimensional point subset 0001 corresponds to signal point subsets (00) and (01).

Figure 3:
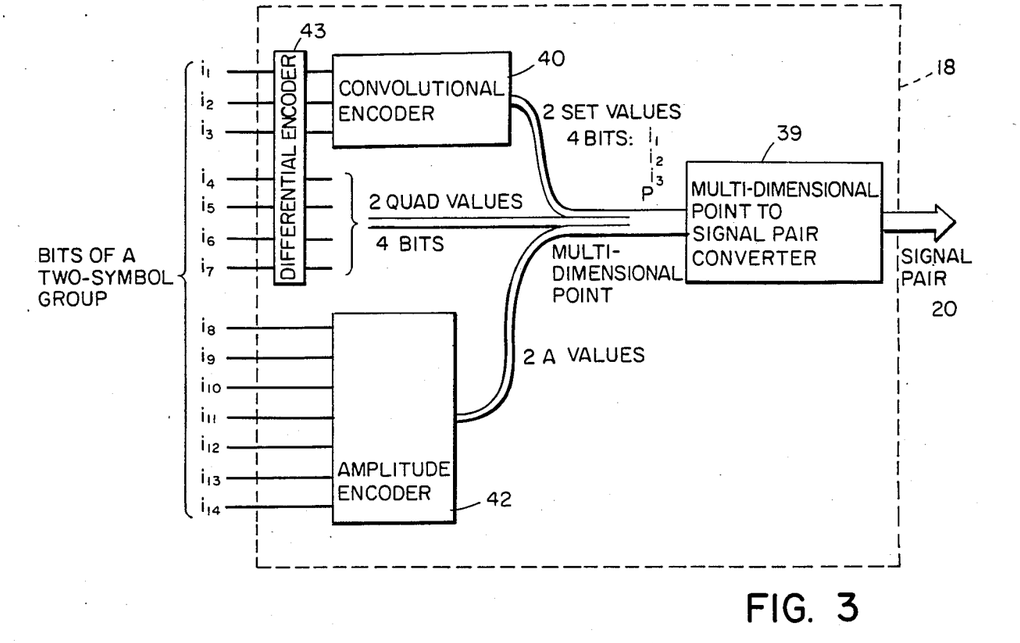
FIG. 3 is a block diagram of the signal selection logic of FIG. 1.

Signal selection logic 18 is arranged to map each incoming two-symbol group comprising 14 bits ($i_1$–$i_{14}$) into a multi-dimensional point which is then converted to two signals points.

Referring to FIG. 3, signal selection logic 18 includes convolutional encoder 40, amplitude coder 42, differential encoder 43, and multi-dimensional-point-to-signal-pair converter 39.

Convolutional encoder 40 takes incoming bits $i_1$–$i_3$ (after manipulation in differential encoder 43) and adds a fourth redundancy bit, p, to give two two-bit values (called SET values) which correspond to the a and b values of the two different subsets from which the two signals are selected. The encoder thus introduces less than one bit per symbol of redundancy into the system, preferably no more than ½ bit per symbol. Bits $i_4$–$i_7$ are passed (after manipulation in differential encoder 43) through to become the four bits constituting the two values (called QUAD values) for identifying the quadrants from which the two signals are selected. Amplitude coder 42 takes bits $i_8$–$i_{14}$ and generates 2 values (called A values) which correspond to the sectors from which the two signals are selected.

The two SET values, two QUAD values, and two A values can be viewed as together specifying one of the 32,768 (i.e., $2^{15}$, where 15 is the number of bits (14) in the symbol group plus the one bit (p) added by encoder 40) possible multi-dimensional points in 4-space, which is then converted by converter 39 to a corresponding pair of signals. The 32,768 multi-dimensional points in the multi-dimensional point alphabet comprise those of the 57,600 four-dimensional points (each corresponding to a possible pair of two-dimensional signal points) which are closest to the origin in 4-space (i.e., require the least energy to send).

Figure 4:
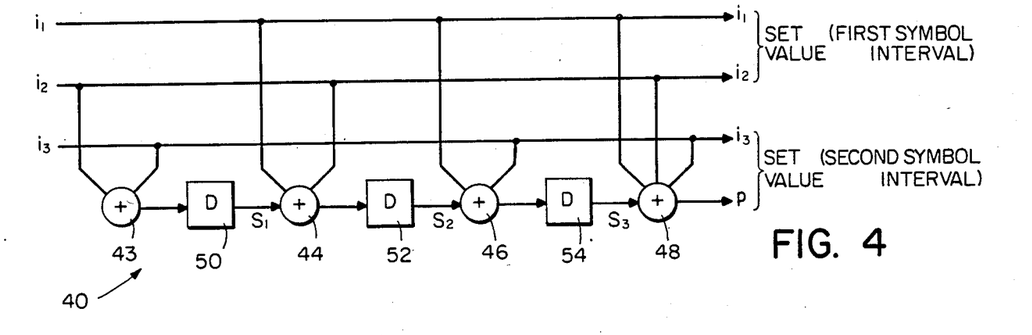
FIG. 4 is a block diagram of the convolution encoder of FIG. 3.

Referring to FIG. 4, convolutional encoder 40 includes four modulo 2 adders 43, 44, 46, 48, each connected to receive at least two of the three bits $i_1$–$i_3$ and three delay (memory) elements 50, 52, 54 (each having a delay of two symbol intervals) connected to adders 42, 44, 46, 48 as shown. Encoder 40 generates the additional bit (p) in each group interval (where a group interval is two symbol intervals corresponding to a two-symbol group) based on the values of bits $i_1$, $i_2$, $i_3$ in the corresponding two-symbol group, and also based on the values of some of the bits $i_1$, $i_2$, $i_3$ in two-symbol groups which appeared in prior group intervals. Bits $i_1$ and $i_2$ become the SET value for the signal sent in the first symbol interval of each group interval, and bits $i_3$ and p become the SET value for the signal sent in the second symbol interval. Thus, the convolutional encoder implements a rate ½ code which adds ½ bit per modulation interval.

The memory elements 50, 52, 54 of convolutional encoder 40 effectively consist of a finite state device having eight possible states each represented by a three-bit value $s_1s_2s_3$ (where $s_1$, $s_2$, and $s_3$ are the respective states of elements 50, 52, 54) and each determined by the historical sequence of input bits $i_1$, $i_2$, and $i_3$. The convolutional encoder in this way assures that the multi-dimensional point subset from which each multi-dimensional point is drawn depends on the multi-dimensional point subsets from which previous multi-dimensional points were drawn, and therefore carries historical information (by means of the ½ bit per symbol of redundancy) about the multi-dimensional point subsets of the preceding multi-dimensional points.

Encoder 40 is a finite state device which passes through a succession of states, the present state being separated in time from the previous state and also from the next state by a group interval.

For a given present state, only four of the eight next states are permissible. The other four of the eight next states are inherently impossible given the encoder's logic circuitry. Which next state occurs depends on the given present state and on which one of the eight possible combinations of $i_1 i_2 i_3$ bits is found in the current two-symbol group to be sent. For example, if the present state is 000 and the $i_1 i_2 i_3$ combination for the next two-symbol group is 000, the next state must be 000. In such a case, the two-symbol group is said to cause a transition from present state 000 to next state 000.

Figure 5:
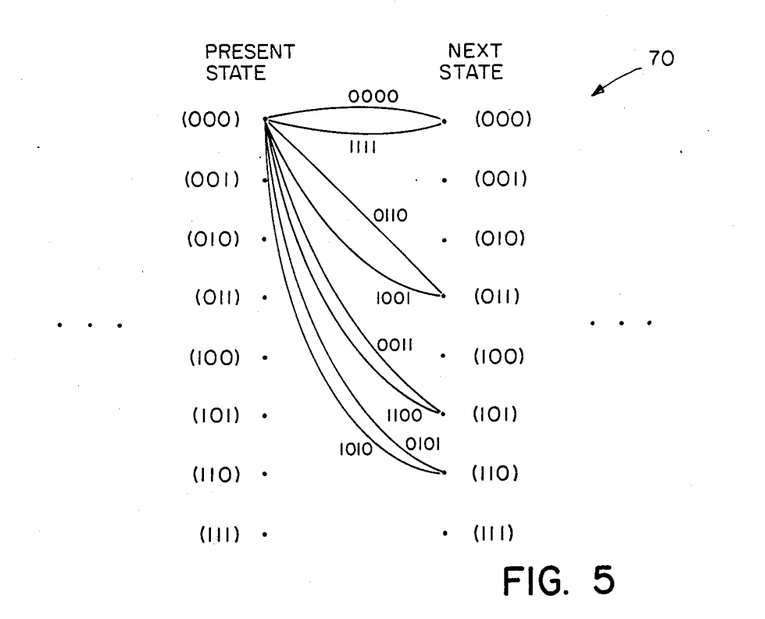
FIG. 5 is a diagram of a portion of a state-transition trellis showing representative transitions between states.

Referring to FIG. 5, a trellis 70 can be used to diagram all permissible transitions between present encoder states and next encoder states. The eight possible present states of encoder 40 are identified by a column of eight points (labeled (000), (001) ... ) where the three bits in parentheses are the bits $s_1$, $s_2$, ($i_1$, $i_2$, $i_3$) of the current two-symbol group to be endoded, and the fourth of which indicates the p bit added by the encoder. Together the four bits labeling a given branch thus correspond to one multi-dimensional point subset.

There is a pair of branches leading from a particular present state to a permissible next state. The two branches in each pair correspond to multi-dimensional points whose multi-dimensional point subset bits are binary complements. For example, the only permissible transitions between state 000 and state 011 are represented by a pair of branches corresponding to type 0110 and type 1001 multi-dimensional points (0110 and 1001 being binary complements).

Figure 6:
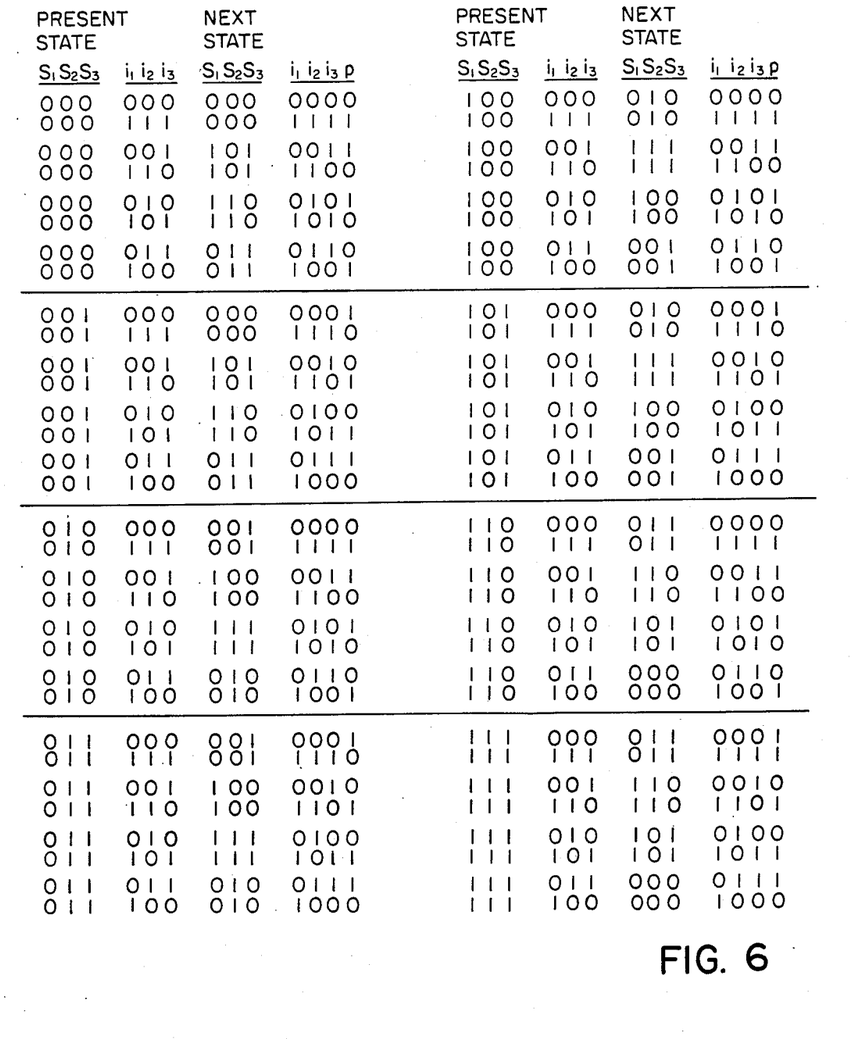
FIG. 6 is a table of state transitions for the trellis of FIG. 5.

Referring to FIG. 6, there are a total of 64 possible transitions (corresponding to trellis branches) between the present states and the permissible next states. Only eight of the 64 possible transitions are shown in FIG. 5, namely those leading from present state 000.

Referring again to FIG. 5, the trellis represents a succession of permissible states spaced apart by group intervals and connected by permissible transitions. Only the states at two points in time are shown in FIG. 5 but the trellis is easily expanded to the left and right by simply repeating the columns of states and the pattern of permissible transitions.

Every permissible sequence of encoder states corresponds to a permissible path along a series of branches through the trellis. Every path in turn corresponds to a sequence of multi-dimensional point subsets corresponding to the branches which make up the path. Thus, in effect, the sequence of multi-dimensional points sent by the transmitter carries with it (in the form of the subsets of the multi-dimensional points sent) information about the encoder's path through the trellis.

As will be seen below, the receiver uses the received multi-dimensional values each corresponding to a pair of the received two-dimensional signals to estimate the encoder's original path through the trellis. Once the path is determined, the multi-dimensional points sent and hence the stream of symbols sent can be reconstructed.

Figure 7:
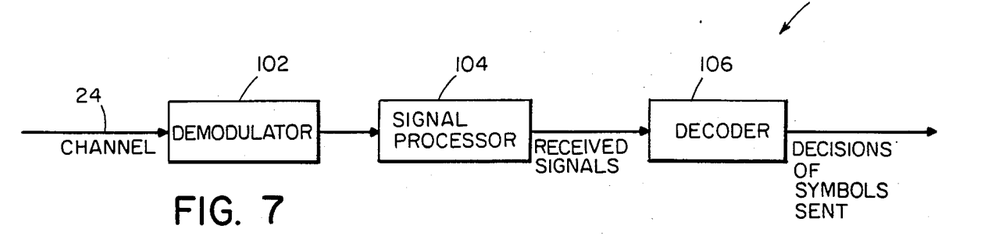
FIG. 7 is a block diagram of a data receiver.

Referring to FIG. 7, in receiver 100 (a programmed microprocessor), the noise affected modulated carrier received from channel 24 is passed through demodulator 102 and signal processor 104 to produce a stream of received two-dimensional signals. Decoder 106 considers the stream of received two-dimensional signals as a stream of received multi-dimensional values and decides which multi-dimensional points (and hence which symbols) were sent by means of a so-called maximum likelihood sequence estimation technique using the Viterbi algorithm discussed in the Forney article.

In general, the decoding process involves first determining which path through the trellis is most likely to have been the one followed by the encoder. Once that maximum likelihood path is found, the sequence of multi-dimensional point subsets corresponding to that path (called the maximum likelihood path history) is used together with the sequence of received multi-dimensional values to decide which multi-dimensional points were sent from among the multi-dimensional point subsets representing the maximum likelihood path history.

The maximum likelihood path is determined by finding which permissible sequence of multi-dimensional point subsets (i.e., which trellis path) is closest (measured in aggregate squared distance in 4-space) to the sequence of received multi-dimensional values. The distance (called a branch metric) between a received multi-dimensional value and a permissible multi-dimensional point from a subset corresponding to a branch of the trellis is simply the squared distance between them in 4-space. The distance (called a path metric) between a received multi-dimensional value sequence and a permissible sequence of multi-dimensional points from subsets corresponding to a permissible trellis path is simply the arithmetic sum of the squared distances between each of the received multi-dimensional values in the sequence and the corresponding multi-dimensional points along the path.

The decoding process steps are repeated in each group interval. Because the decoding depends on analysis of a sequence of received multi-dimensional values, the decision of which multi-dimensional point was sent in a particular interval must be delayed for a number of group intervals until the probability of error in estimating the most likely trellis path is acceptably small.

For a given group interval, the first decoding step is to find the one multi-dimensional point in each subset which is closest to the received multi-dimensional value. This step alone reduces from 32,768 to 16 the number of contending multi-dimensional points for that interval.

Figure 8:
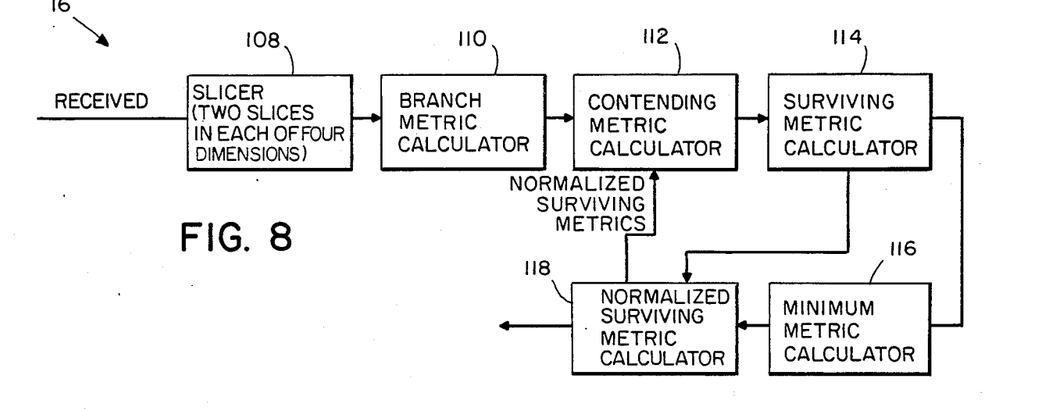
FIG. 8 is a block diagram of the decoder of FIG. 7.

Referring to FIG. 8, this is done by passing the received multi-dimensional value through slicer 108 which performs two conventional slicing operations on the multi-dimensional point alphabet in each of four dimensions in the vicinity of the received multi-dimensional value.

next, in branch metric calculator 110, the squared distance between each received multi-dimensional value and each of the sixteen contending multi-dimensional points is computed. These squared distances are denoted $d^2(0000)$, $d^2(0001)$ ... where the value in parentheses indicates the multi-dimensional point subset. For example, the value $d^2(0000)$ is the squared distance between the received multi-dimensional value and the contending multi-dimensional point in the 0000 subset.

Recalling that each present state and each corresponding permissible next state in the trellis are connected by a pair of branches corresponding to two different subsets of multi-dimensional points, and that there is only one most likely path through the trellis, only one branch of each pair of branches can lie on the maximum likelihood path. Thus, it is possible at this stage to reduce by half the number of contending branches simply by determining which branch of each pair represents the multi-dimensional point subset which is closer to the received multi-dimensional value.

To do this, branch metric calculator 110 determines as a so-called branch pair metric for each branch pair, denoted, e.g., b(000), the smaller of the previously determined branch metrics corresponding to the two branches in the pair. For example b(000)=min. [$d^2(0000)$, $d^2(1111)$], b(001)=min [$d^2(0001)$, $d^2(1110)$].

The next step (performed by contending metric calculator 112) is to take the branch pair metric leading from each present state and add it to a so-called normalized surviving metric of that present state (determined in the manner described below) to obtain a so-called contending metric.

Figure 9:
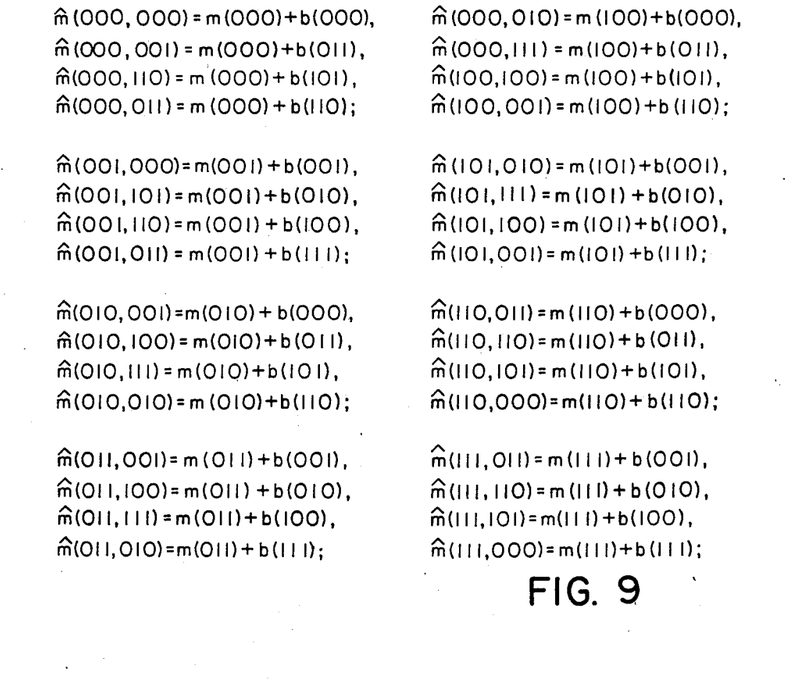
FIG. 9 is a table of contending metric calculations.

Referring to FIG. 9, the eight surviving metrics are denoted m(000), m(001) . . . where the value in parentheses denotes a present state. The 32 contending metrics are denoted m(000,000), m(000,001) . . . where the values in parentheses denote a present state and a permissible next state.

There are four contending branches leading into each next state but only one can be in contention against the contending branches leading into the other next states, namely the one whose branch pair metric combined with the surviving metric of the present state from which the branch leads, produces the smallest contending metric.

Figure 10:
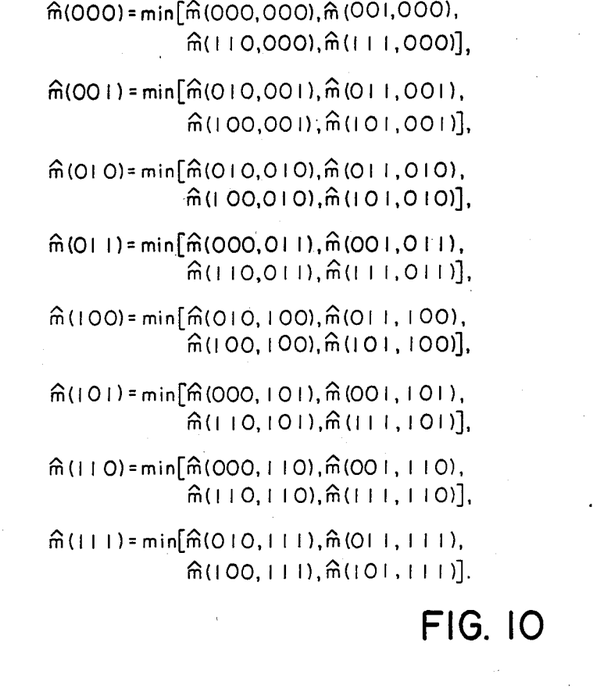
FIG. 10 is a table of surviving metric calculations.

Referring to FIG. 10, the smallest contending metric for each next state is determined by simple comparisons, each yielding a surviving metric denoted, e.g., m(000), where the value in parentheses corresponds to the new state.

Of the eight surviving branches to the eight next states, only one is part of the maximum likelihood path, namely the one for which the surviving metric has the minimum value.

This minimum surviving metric (m(min)) is found (by minimum metric calculator 116, FIG. 8) from among the eight surviving metrics, i.e., m(min)=min.

Finally, the minimum metric is subtracted from each of the normalized surviving metrics (by normalized surviving metric calculator 118, FIG. 8) to prevent the normalized surviving metrics from growing without bound.

This minimum surviving metric for the next group interval thus represents the minimum path metric through the trellis corresponding to the historical sequence of received multi-dimensional values. The decoder has thus determined the maximum likelihood path of the encoder through the trellis.

The next step is to determine the corresponding sequence of sent multi-dimensional points. For each of the eight possible present states, decoder 106 stores a so-called present surviving path history identifying the sequence of multi-dimensional points which correspond to the surviving path leading to each present state. When the eight surviving metrics for the eight possible next states are calculated, the decoder creates a next surviving path history for each next state. Each next surviving path history contains the multi-dimensional point corresponding to the surviving metric leading to each next state plus the sequence of past multi-dimensional points of the corresponding present surviving path history.

The next surviving path history which corresponds to the minimum surviving metric contains the sequence of multi-dimensional points which is the best estimate at that time of the sequence of multi-dimensional points sent.

In a given surviving path history the multi-dimensional points which are many group intervals old are more likely to be correct than more recent multi-dimensional points. The decision of which multi-dimensional point was sent in a given group interval is made after the passage of a predetermined number of group intervals (e.g., 16) selected such that the probability of error is acceptably low.

The coding gain produced by the described coding system depends on the error probability and on the average energy required to send the two-dimensional signal points.

The error probability can be determined by first considering the output of the encoder as a bit stream $$i_1^{(1)} i_2^{(1)} i_3^{(1)} p^{(1)} i_1^{(2)} i_2^{(2)} i_3^{(2)} p^{(2)} \ldots i_1^{(n)} i_2^{(n)} i_3^{(n)} p^{(n)}$$

where, e.g., $i_2^{(2)}$ is the value of output bit $i_2$ for the second group interval. It is then possible to determine as a so-called impulse response the string of those output bits of encoder 40 which will have "1" values (as determined by the logic of encoder 40) when a single predetermined input bit has a "1" value. For example, the impulse response resulting from only bit $i_1$ having a "1" value for the first group interval can be represented by the impulse response $$i_1^{(1)} p^{(1)} p^{(2)} p^{(3)}$$

meaning that $i_1^{(1)} = p^{(1)} = p^{(2)} = p^{(3)} = 1$. Similarly the impulse responses respectively resulting from $i_2^{(1)} = 1$ and $i_3^{(1)} = 1$, are $$i_2^{(1)} p^{(1)} p^{(3)} p^{(4)}$$

$$i_3^{(1)} p^{(1)} p^{(2)} p^{(4)}$$

All other possible bit sequences (called code sequences) are shifts and linear (mod 2) combinations of the three impulse responses.

The difference (mod 2 sum) between any two code sequences is another code sequence, and therefore, the minimum Hamming distance between any two code sequences generated by encoder 40 is the minimum number of 1 values (called the minimum weight) in a non-zero code sequence. Because the impulse responses each have weight 4, which is even, the minimum Hamming distance must be either 2 or 4. However, no linear combination of the impulse responses has weight 2, so the minimum distance must be 4.

Figure 11:
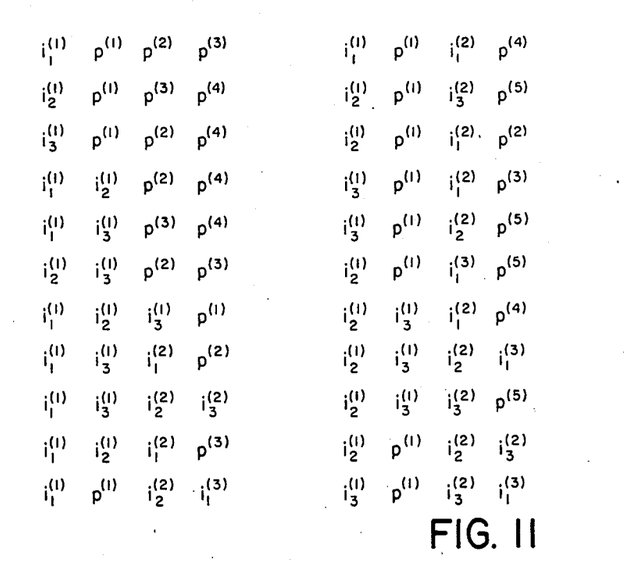
FIG. 11 is a table of minimum weight code sequences.

Referring to FIG. 11, there are 22 distinct minimum weight code sequences.

Thus, the minimum noise energy required to cause an error in decoding is $4d_0^2$, where $2d^0$ is the minimum distance between any two two-dimensional signal points (i.e., $d_0$ is the distance from a two-dimensional signal point to the nearest decision boundary in two-dimensional space.) Such an error could occur in the direction of any of the 22 distinct minimum weight code sequences of FIG. 11, in each case in any of sixteen ways per group interval. In addition, the $4d_0^2$ noise energy could cause an error between neighboring multi-dimensional points in single subset in any one of eight different ways in each group interval. Thus, the union bound of error probability per group interval is 22 times 16 plus 8 equals $360Q(2d_0)$. Simulations suggest that this union bound is conservative by a factor of 2 so that the error probability per symbol interval is approximately $90Q(2d_0)$ compared with $4Q(d_0)$ for an uncoded system.

Using the rule of thumb that in the error rate region of interest, every factor of 2 in increased error rate corresponds to a cost of 0.2 db in signal-to-noise ratio, the error coefficient penalty for the described coding system is 0.9 db compared with an uncoded system.

The $4d_0^2$ minimum noise energy for the coded system gives a 6 db gross coding gain over uncoded systems (which have a $d_0^2$ minimum noise energy), which is offset not only by the 0.9 db loss from increased error probability, but also by the additional 1.5 db needed to send the extra bit (p) per group interval which the encoder adds to the original 14 bits of each two-symbol group. Thus, the net coding gain is 6 db $-$ 1.5 db $-$ 0.9 db = 3.6 db.

Figure 12:
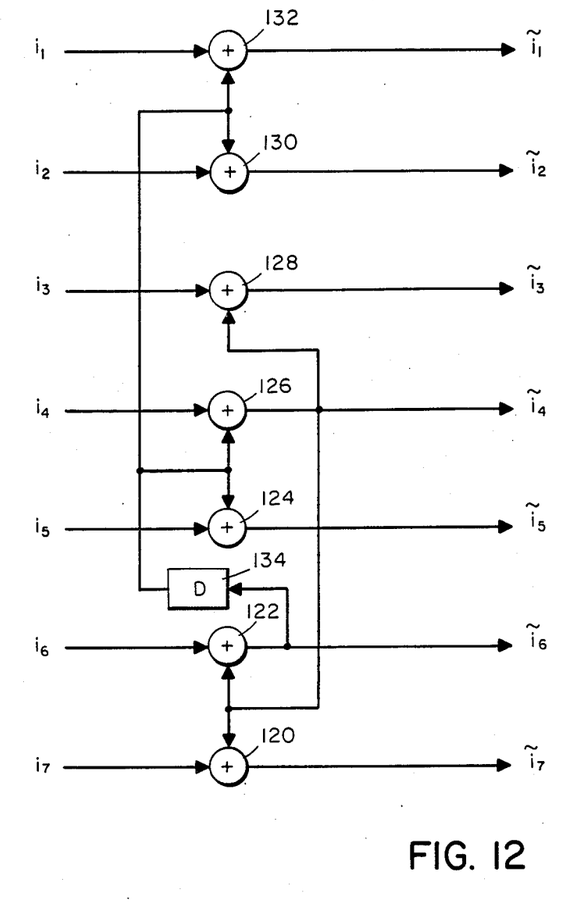
FIG. 12 is a block diagram of the differential encoder of FIG. 3.

Referring to FIG. 12, differential encoder 43 includes modulo 2 summers 120, 122, 124, 126, 128, 130, 132, and delay element 134 (representing a one group interval delay) which together convert incoming bits $i_1$ through $i_7$ to differentially encoded bits $\bar{i}_1$ through $\bar{i}_7$. Bits $\bar{i}_1$ and $\bar{i}_2$ are the SET bits for the first symbol interval in each group interval. Bit $\bar{i}_3$, together with bit p are the SET bits for the second symbol interval. Bits $\bar{i}_4$, $\bar{i}_5$ and $\bar{i}_6$, $\bar{i}_7$ are respectively the QUAD bits for the first and second symbol intervals. (The assignments of QUAD bits to quadranfs are shown on FIG. 2.)

The differential encoder effectively complements the SET and QUAD bits of the signal point to be sent if the previous signal point was in the bottom half-plane (i.e., had 1 as its first QUAD bit). The complementing is accomplished by delivering the output of delay element 134 to summers 124, 126, 130, 132. Because $i_1 i_2 i_3$ are complemented, the parity bit (p) is also complemented. The A bits remain unchanged so the pair of resulting signal points is 180° out of phase with the pair that would have been generated had $\bar{i}_6$ been 0 in the previous group interval.

At the receiver, the reverse process is performed at the output of decoder 106, ensuring that a 180° phase reversal on the channel will cause only a momentary error in the decoded symbols.

Other embodiments are within the following claims.

I claim:

1. In a modulation system for sending digital symbols generated by a data source over a band-limited channel in accordance with a sequence of multi-dimensional points each composed of a plurality of two-dimensional modulation signal points, and each selected from an available alphabet of said multi-dimensional points by an encoder on the basis of a group of said digital symbols, the improvement comprising
   circuitry connected to be responsive to said data source for accumulating said symbols of each said group, and
   circuitry connected to be responsive to said accumulating circuitry for thereafter selecting said multi-dimensional point for said group, and wherein
   said available alphabet comprises a plurality of subsets of said multi-dimensional points, and
   the subset from which the multi-dimensional point is selected for each said group depends on the subset from which the multi-dimensional point is selected for another said group.

2. In a modulation system for sending digital symbols generated by a data source over a band-limited channel in accordance with a sequence of multi-dimensional points each composed of a plurality of two-dimensional signal points, said modulation system comprising,
   circuitry connected to be responsive to said data source for accumulating groups of said symbols,
   selection circuitry connected to be responsive to said accumulating circuitry for selecting one said multi-dimensional point for each said group from an available alphabet of multi-dimensional points, and
   modulator circuitry connected to be responsive to said selection circuitry for modulating a carrier in accordance with the signal points of which said selected multi-dimensional points are composed, at a rate of 1/T signal points per second,
   the improvement wherein
   said available alphabet has a plurality of subsets of said multi-dimensional points, and
   said selection circuitry comprises
   means connected to be responsive to said accumulating circuitry for causing the multi-dimensional point for each said group to be selected from a subset which depends on the subset from which the multi-dimensional point is selected for another said group.

3. The improvement of claim 1 or 2 wherein said selection circuitry includes means responsive to said accumulating means for adding to the information carried by said symbols less than one bit per symbol interval of information about the dependencies among said selected multi-dimensional points.

4. The improvement of claim 3 wherein said accumulating circuitry is arranged to add no more than one-half bit per symbol interval.

5. The improvement of claim 1 or 2 further comprising a decoder connected to be responsive to said channel for deciding which said multi-dimensional points were sent by applying a maximum likelihood sequence estimation technique to a sequence of multi-dimensional values received over said channel.

6. The improvem:ent of claim 1 or 2 wherein said selection circuitry comprises a finite state device connected to be responsive to said accumulating circuitry and whose next stage depends upon at least an earlier state of said device.

7. The improvement of claim 1 or 2 wherein there are a plurality of subsets of said modulation signal points and the minimum squared distance in two-dimensional space between modulation signal points from the same subset is greater than the minimum squared distance between any two modulation signal points.

8. The improvement of claim 1 or 2 wherein each said group comprises an integral number of bits.

9. The improvement of claim 1 or 2 wherein each said group comprises two said symbols and said multi-dimensional point alphabet is four-dimensional.

10. The improvement of claim 6 wherein said finite state device has eight states.

11. The improvement of claim 10 wherein each symbol comprises 7 bits and there are 240 distinct two-dimensional signal points.

12. The improvement of claim 1 or 2 wherein said modulation system is a double side band--quadrature carrier system.

13. The improvement of claim 1 or 2 wherein there are four subsets of said modulation signal points.

14. The improvement of claim 1 or 2 further comprising circuitry for effecting 180° differential encoding of said symbols.

* * * * *